US012593701B2

(12) United States Patent
Seng et al.

(10) Patent No.: US 12,593,701 B2
(45) Date of Patent: Mar. 31, 2026

(54) EPOXY OVER-MOLDED CAPACITOR ASSEMBLY

(71) Applicant: S&C Electric Company, Chicago, IL (US)

(72) Inventors: Nicholas Seng, Chicago, IL (US); Goran Djogo, Mount Prospect, IL (US); Daniel Desmond, Chicago, IL (US); Thomas S. Kelley, Highland Park, IL (US); Michael R. Maroney, Chicago, IL (US); Kyle A Weaver, Chicago, IL (US); Andrew J. Steveson, Chicago, IL (US)

(73) Assignee: S&C Electric Company, Chicago, IL (US)

( * ) Notice: Subject to any disclaimer, the term of this patent is extended or adjusted under 35 U.S.C. 154(b) by 282 days.

(21) Appl. No.: 18/316,332

(22) Filed: May 12, 2023

(65) Prior Publication Data

US 2024/0038445 A1     Feb. 1, 2024

Related U.S. Application Data

(60) Provisional application No. 63/393,293, filed on Jul. 29, 2022.

(51) Int. Cl.
| | |
|---|---|
| *H10W 44/00* | (2026.01) |
| *H01G 4/228* | (2006.01) |
| *H01G 4/38* | (2006.01) |
| *H01G 4/40* | (2006.01) |
| *H01G 2/22* | (2006.01) |

(52) U.S. Cl.
CPC .......... *H10W 44/601* (2026.01); *H01G 4/228* (2013.01); *H01G 4/38* (2013.01); *H01G 4/40* (2013.01); *H01G 2/22* (2013.01)

(58) Field of Classification Search
None
See application file for complete search history.

(56) References Cited

U.S. PATENT DOCUMENTS

| | | | | | |
|---|---|---|---|---|---|
| 2,721,310 A | * | 10/1955 | Schenker | ................. | H01G 4/38 |
| | | | | | 333/182 |
| 2,987,813 A | * | 6/1961 | Pope | ..................... | H01C 1/024 |
| | | | | | 338/237 |

(Continued)

FOREIGN PATENT DOCUMENTS

JP          56153721 A    *  11/1981

*Primary Examiner* — Eric W Thomas

(57) ABSTRACT

An electrical device including a first cylindrical capacitor, a first terminal electrically coupled to one end of the first capacitor, a first electrical line electrically coupled to the first terminal and a first annular conductive end shield formed over the first terminal and being electrically coupled to the first terminal and the one end of the first capacitor, where the first end shield has a greater diameter than the diameter of the first capacitor. The device also includes a second cylindrical capacitor, a second terminal electrically coupled to one end of the second capacitor, a second electrical line electrically coupled to the second terminal and a second annular conductive end shield formed over the second terminal and being electrically coupled to the second terminal and the one end of the second capacitor, where the second end shield has a greater diameter than the diameter of the second capacitor.

16 Claims, 2 Drawing Sheets

(56)                   References Cited

U.S. PATENT DOCUMENTS 3,014,167   A   *   12/1961   Winter ..................... H01G 4/38
                                                                  361/329
3,255,396   A   *   6/1966   Heron, Jr. ................ H01G 4/35
                                                                    361/302
3,541,284   A   *   11/1970   Wachta ........... H01H 33/66261
                                                                    218/136
4,228,318   A   *   10/1980   Selsing .................. H02G 15/30
                                                                    174/143
2009/0141419   A1*   6/2009   Pal ......................... H01G 11/82
                                                                    29/25.42
2017/0215833   A1*   8/2017   Krumme ............. H05K 9/0081

* cited by examiner

EPOXY OVER-MOLDED CAPACITOR ASSEMBLY

CROSS-REFERENCE TO RELATED APPLICATION

This application claims the benefit of priority from the U.S. Provisional Application No. 63/393,293, filed on Jul. 29, 2022, the disclosure of which is hereby expressly incorporated herein by reference for all purposes.

BACKGROUND

Field

The present disclosure relates generally to an electrical device and, more particularly, to an electrical device that includes electrical and mechanical shielding and is molded in an epoxy.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeders including three single-phase feeder lines that carry the same current, but are 120° apart in phase. A number of three-phase and single phase lateral lines are tapped off of the feeder that provide the medium voltage to various distribution transformers, where the voltage is stepped down to a low voltage and is provided to a number of loads, such as homes, businesses, etc.

Some power distribution networks may employ a number of underground single-phase lateral circuits that feed residential and commercial customers. Often times these circuits are configured in a loop and fed from power sources at both ends, where an open circuit location in the loop isolates the two power sources. Transformers are dispersed along the loop that each service a number of loads, where the open circuit location is typically provided at one of the transformers. A single-phase line is coupled to the primary coil in each transformer so that current flows to the primary coils along the loop. It has been proposed in the art to provide a switching device at the source side and the load side of each transformer between the primary coil and the line that includes, for example, a vacuum interrupter. The two switching devices in each transformer can be controlled by a common control unit that provides fault isolation and power restoration in response to a fault in the line.

The switching devices employed in these and other systems and networks often need to be in communication with each other for fault detection and power restoration purposes. That communication can be provided in a number of manners including hardwired lines and wireless communications. However, these types of communications provide an added expense to the devices and are often unreliable. Therefore, it has been proposed in the art to provide power line communications (PLC) where high frequency RF communications signals are transmitted over the power lines themselves. Such a communications protocol sometimes requires coupling between a high voltage line and a low voltage generally using capacitors.

Ceramic capacitors are an excellent choice for PLC applications on medium and high voltage distribution systems. Further, Cypoxy™ insulation is a proven material for insulating devices of this type. Directly molding a ceramic capacitor into Cypoxy™ can provide a self-contained insulator with the ability to transmit high frequency signals overlaid onto the system AC frequency for PLC. This can also be utilized as a component in a larger body of insulation, such as a voltage sensor, station post insulator or interrupting module to communicate between low voltage equipment on the same distribution system without the need for dedicated communication lines or radios.

Cypoxy™ and ceramic have significantly different coefficients of thermal expansion (CTE), as well as issues bonding the two dissimilar materials. Both of these factors cause issues at the interface between the two materials. Separation and damage at temperature extremes and delamination at the interfaces can cause partial discharge and other negative electrical effects up to and including insulation breakdown. Also, cracking of the Cypoxy™ can occur at sharp corners of the ceramic capacitors.

Several methods exist in the art to mitigate these issues including cold shrink surrounding the capacitors and separately potting the capacitors into a pre-molded Cypoxy body. These methods, while effective, result in additional labor steps and complexity, and are therefore not well suited for small assemblies with low cost targets.

Additional problems occur with the terminals of ceramic capacitors. Solder joints at the ends, and in the center for capacitors in series, will inevitably have sharp corners that cause electrical stresses. Even the geometry of a suitable cylindrical ceramic capacitor has sharp corners as a byproduct of the limitations of the manufacturing processes to obtain the required capacitance values. The concerns with electrical stresses are compounded when the ground plane is in close proximity to the high voltage side of the capacitors. In underground medium voltage applications, a surface ground layer is necessary for safety reasons, but this results in competing design criteria, namely, low electrical stresses and compact profiles. Similar devices are desirable for weight and cost savings, but necessarily result in higher electrical stresses.

SUMMARY

The following discussion discloses and describes an electrical device that includes electrical and mechanical shielding and is molded in an epoxy. The device includes a first cylindrical capacitor including conductive ends, a first terminal electrically coupled to one end of the first capacitor, a first electrical line electrically coupled to the first terminal and a first annular conductive end shield formed over the first terminal and being electrically coupled to the first terminal and the one end of the first capacitor, where the first end shield has a greater diameter than the diameter of the first capacitor. The device also includes a second cylindrical capacitor including conductive ends, a second terminal electrically coupled to one end of the second capacitor, a second electrical line electrically coupled to the second terminal and a second annular conductive end shield formed over the second terminal and being electrically coupled to the second terminal and the one end of the second capacitor, where the second end shield has a greater diameter than the diameter of the second capacitor. The device further includes an electrical connector electrically coupled to an end of the first capacitor opposite to the first terminal and electrically coupled to an end of the second capacitor opposite to the second terminal.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to an electrical device that includes electrical and mechanical shielding and is molded in an epoxy is merely exemplary in nature, and is in no way intended to limit the disclosure or its applications or uses. For example, the device has particular application for use in a switching device associated with transformers in a residential loop circuit. However, the electrical device may have other applications.

Figure 1:
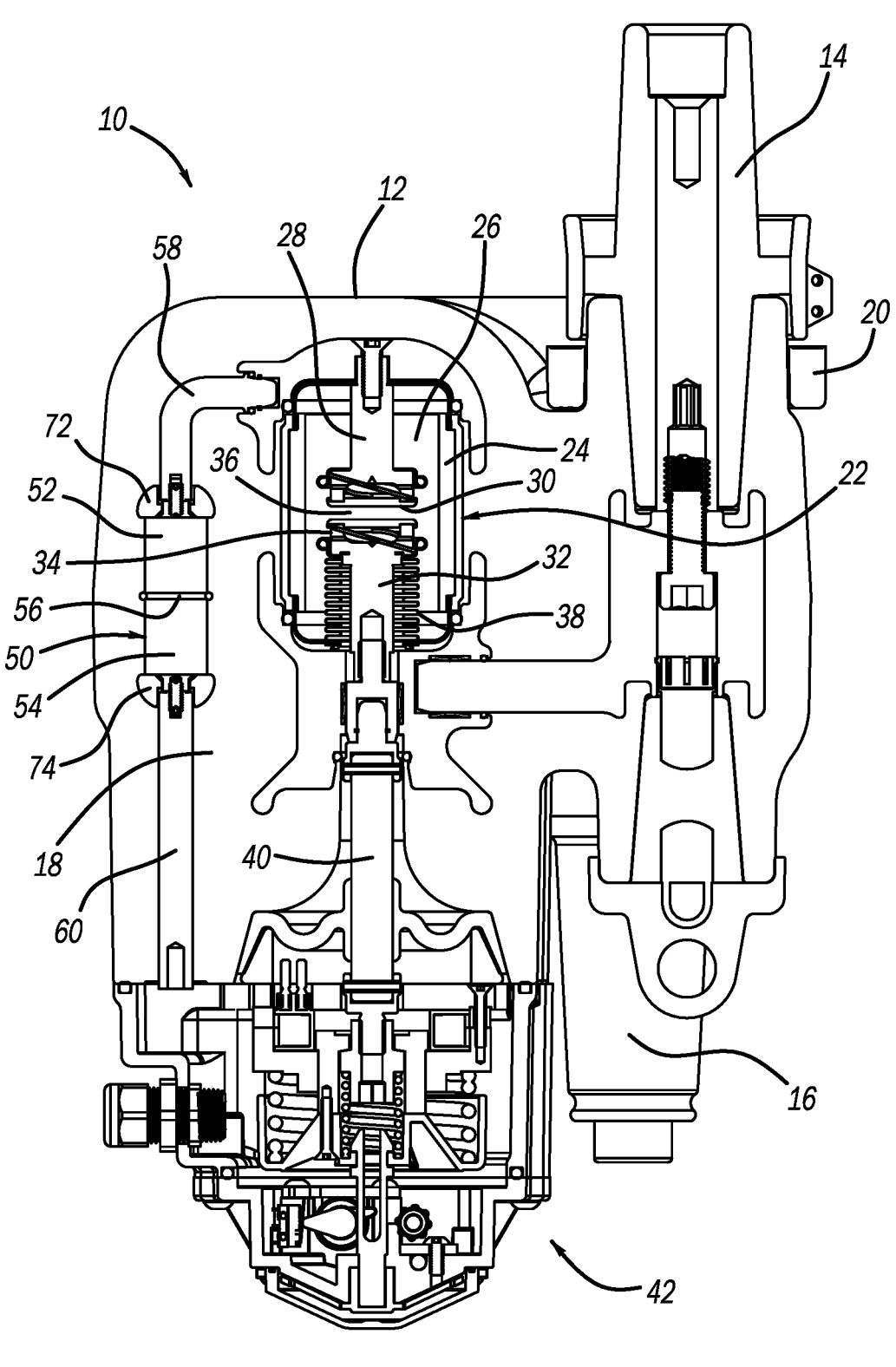
FIG. 1 is a cross-sectional type view of a switching device including a capacitor assembly unit for coupling high to low voltage for PLC.

FIG. 1 is a cross-sectional type view of an electrical switching device 10 depicting a non-limiting example merely for illustrative purposes provided that has application to be provided at a source side or a load side of a transformer positioned between the primary coil and power line in an underground single-phase lateral circuit that employs PLC. The switching device 10 includes an outer enclosure 12, a transformer interface 14 and a load-break connector interface 16. The components within the enclosure 12 are encapsulated and molded within an insulating medium 18, such as Cypoxy™, that provides electrical shielding, where many of the components are conductors operating at medium or high voltage potential. A Rogowski coil 20 measures current flow through the switching device 10. The switching device 10 includes a vacuum interrupter 22 having a vacuum enclosure 24 defining a vacuum chamber 26, an upper fixed terminal 28 extending through the enclosure 24 and into the chamber 26 and having a contact 30 and a lower movable terminal 32 extending through the enclosure 24 and into the chamber 26 and having a contact 34, where a gap 36 is provided between the contacts 30 and 34 when the vacuum interrupter 22 is open. A bellows 38 allows the movable terminal 32 to move without affecting the vacuum integrity of the chamber 26. The movable terminal 32 is coupled to a drive rod 40 that is coupled to an actuator assembly 42 for opening and closing the vacuum interrupter 22.

Figure 2:
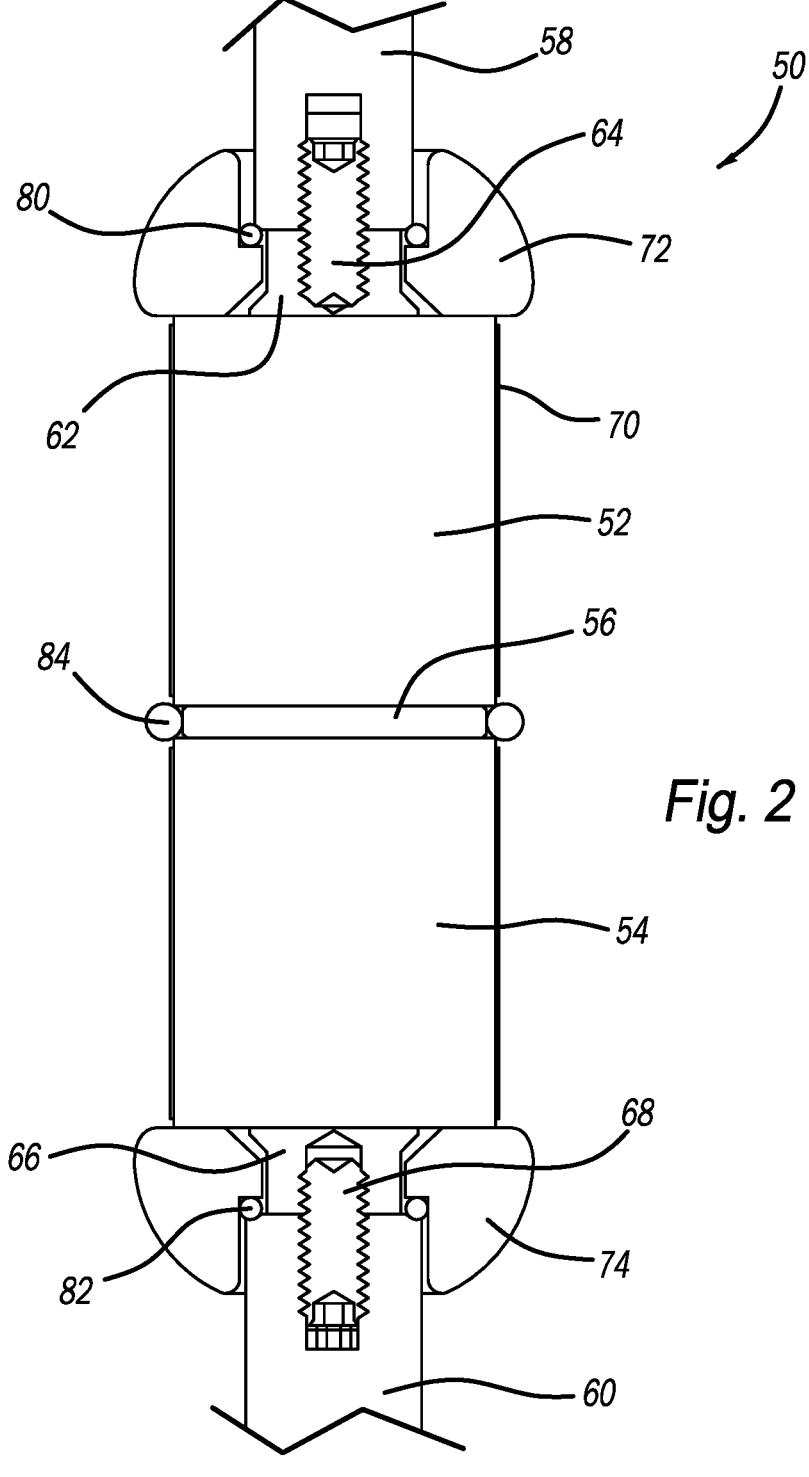
FIG. 2 is a cross-sectional type view of the capacitor assembly unit separated from the switching device.

A capacitor assembly unit 50 is directly molded into the Cypoxy™ insulating medium 18 and is in electrical parallel with the vacuum interrupter 22. FIG. 2 is a cross-sectional view of the capacitor assembly unit 50 separated from the switching device 10. The unit 50 includes two single layer ceramic cylindrical disc capacitors 52 and 54 having metalized ends electrically coupled at their center end to a metal connector 56, such as a brass member, by soldering. The capacitors 52 and 54 are provided in electrical series between a high voltage distribution bus 58 coupled to the upper fixed terminal 28 in the vacuum interrupter 22 and a low voltage distribution bus 60 coupled to control components (not shown) for providing, for example, voltage sensing, power line communications (PLC), energy harvesting, etc. An outer surface of the ceramic capacitors 52 and 54 is glazed with a glass coating 70, which promotes coupling to the medium 18, but there is no additional coating to promote bonding to the Cypoxy™. A metal terminal 62, such as a brass terminal, is soldered to an end of the capacitor 52 opposite to the metal connector 56 and is secured and electrically coupled to the high voltage bus 58 by a threaded pin 64. Likewise, a metal terminal 66, such as a brass terminal, is soldered to an end of the capacitor 54 opposite to the metal connector 56 and is secured and electrically coupled to the low voltage bus 60 by a threaded pin 68. An annular curved or cup-shaped end shield 72 is formed over the terminal 62 and an annular curved or cup-shaped end shield 74 is formed over the terminal 66, where the shields 72 and 74 are made in one non-limiting embodiment of a semiconductive bulk molded compound (BMC). The chosen BMC material for the shields 72 and 74 is closer to the CTE of Cypoxy™, and more resilient than the ceramic of the capacitors 52 and 54, thus providing a better interface at temperature extremes. The shields 72 and 74 operate to cover any solder blobs that are an artifact of soldering the terminals 62 and 66 to the capacitors 52 and 54. The shields 72 and 74 also have a larger diameter than the capacitors 52 and 54 to provide an overhang to cover the sharp end edges of the capacitors 52 and 54 and to accommodate a wide positional tolerance of the terminals 62 and 66. This geometry blends the electrical fields that would have been concentrated at the solder blobs and the sharp edges of the capacitors 52 and 54 to reduce electrical stresses that may otherwise occur.

An O-ring 80 is provided around the terminal 62 and makes a continuous electrical connection between the shield 72 and the bus 58 and an O-ring 82 is provided around the terminal 66 and makes a continuous electrical connection between the shield 74 and the bus 60, where the O-rings 80 and 82 are made from silicone rubber with a large percentage of carbon acting as a conductive filler. An O-ring 84, also made from the same material, is provided around the metal connector 56 and acts as a midpoint shield between the capacitors 52 and 54. Specifically, the O-ring 84 covers the solder blobs on the connector 56 and ends of the capacitors 52 and 54 created when the capacitors 52 and 54 are soldered to the connector 56 so that they are shielded by the round profile of the O-ring 84. At large pressures during molding, the rubber of the O-ring 84 conforms to the curves of the unit 50, but still retains a generally round shape, thus preventing any high electrical stress points. At temperature extremes, the rubber will be able to conform to the space in and around the ceramic/metal/Cypoxy™ interface created by the capacitors 52 and 54, the connector 56 and the medium 18.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An electrical device comprising:
a first capacitor including conductive ends;
a first terminal electrically coupled to one end of the first capacitor;
a first electrical line electrically coupled to the first terminal;

a first conductive end shield formed over the first terminal and being electrically coupled to the first terminal and the one end of the first capacitor; and an O-ring formed of a semi-conductive material disposed around the first terminal and being in electrical contact with the first conductive end shield and the first line.

2. The device according to claim 1 wherein the first conductive end shield has an outer curved configuration.

3. The device according to claim 1 wherein the first conductive end shield is formed of a semiconductive material.

4. The device according to claim 3 wherein the first conductive end shield is made of a bulk molded compound (BMC).

5. The device according to claim 1 wherein the first capacitor is cylindrical and the first conductive end shield is annular and having a greater diameter than the diameter of the first capacitor.

6. The device according to claim 1 wherein the O-ring is made from silicone rubber impregnated with a sufficient amount of carbon to act as a conductive filler.

7. The device according to claim 1 wherein the first capacitor includes an outer layer of glazed glass.

8. The device according to claim 1 wherein the device is over molded and encapsulated in an epoxy.

9. The device according to claim 8 wherein the epoxy is cycloaliphatic epoxy resin.

10. The device according to claim 1 further comprising a second capacitor including conductive ends, a second terminal electrically coupled to one end of the second capacitor, a second electrical line electrically coupled to the second terminal, and a second conductive end shield formed over the second terminal and being electrically coupled to the second terminal and the one end of the second capacitor, said first and second capacitors being electrically coupled together by an electrical connector at ends of the first and second capacitors opposite to the first and second terminals.

11. The device according to claim 10 further comprising a conductive O-ring formed around the second terminal and being in electrical contact with the second conductive end shield and the second line.

12. The device according to claim 10 further comprising a conductive O-ring formed around the electrical connector.

13. The device according to claim 1 wherein the device is part of a switch.

14. An electrical device that is part of a switch, said device comprising:

a first cylindrical capacitor including conductive ends;

a first terminal electrically coupled to one end of the first capacitor;

a first electrical line electrically coupled to the first terminal;

a first annular conductive end shield formed over the first terminal and being electrically coupled to the first terminal and the one end of the first capacitor, said first end shield having a greater diameter than the diameter of the first capacitor;

a second cylindrical capacitor including conductive ends;

a second terminal electrically coupled to one end of the second capacitor;

a second electrical line electrically coupled to the second terminal;

a second conductive end shield formed over the second terminal and being electrically coupled to the second terminal and the one end of the second capacitor, said second end shield having a greater diameter than the diameter of the second capacitor;

an electrical connector electrically coupled to an end of the first capacitor opposite to the first terminal and electrically coupled to an end of the second capacitor opposite to the second terminal; and a first O-ring formed of a semi-conductive material disposed around the first terminal and being in electrical contact with the first conductive end shield and the first line and a second O-ring formed of semi-conductive material disposed around the second terminal and being in electrical contact with the second conductive end shield and the second line.

15. The device according to claim 14 wherein the first and second capacitors include an outer layer of glazed glass.

16. The device according to claim 14 wherein the device is over molded and encapsulated in an epoxy.

* * * * *